(12) United States Patent
Zou

(10) Patent No.: US 11,953,549 B1
(45) Date of Patent: Apr. 9, 2024

(54) DETECTION SYSTEM FOR SLIMSAS SLOT AND METHOD THEREOF

(71) Applicants: Inventec (Pudong) Technology Corporation, Shanghai (CN); Inventec Corporation, Taipei (TW)

(72) Inventor: Kai Zou, Shanghai (CN)

(73) Assignees: Inventec (Pudong) Technology Corporation, Shanghai (CN); Inventec Corporation, Taipei (TW)

(*) Notice: Subject to any disclaimer, the term of this patent is extended or adjusted under 35 U.S.C. 154(b) by 0 days.

(21) Appl. No.: 18/065,962

(22) Filed: Dec. 14, 2022

(30) Foreign Application Priority Data

Nov. 24, 2022 (CN) .......................... 202211481618.5

(51) Int. Cl.
*G01R 31/28* (2006.01)
*G01R 31/3185* (2006.01)

(52) U.S. Cl.
CPC .................. *G01R 31/31855* (2013.01); *G01R 31/318552* (2013.01)

(58) Field of Classification Search
CPC .................. G01R 31/31855; G01R 31/318552
See application file for complete search history.

(56) References Cited

U.S. PATENT DOCUMENTS

| | | | | |
|---|---|---|---|---|
| 5,841,670 A | * | 11/1998 | Swoboda | G01R 31/318552 703/23 |
| 2011/0148456 A1 | * | 6/2011 | Mooyman-Beck | G01R 31/318511 361/807 |
| 2015/0067424 A1 | * | 3/2015 | Waltermann | G01R 31/318536 714/726 |

* cited by examiner

*Primary Examiner* — Christine T. Tu
(74) *Attorney, Agent, or Firm* — David R. Stevens; Stevens Law Group

(57) ABSTRACT

A detection system for a SlimSAS slot and a method thereof are disclosed. In the detection system, a detecting device generates and transmits a detection signal to a TAP controller; the TAP controller converts the received detection signal into a detection signal in JTAG format, and transmits the detection signal in JTAG format to a CPLD chip and a controllable power module chip of a detection card and/or a boundary scan chip of a circuit board; a detection can be performed on the SMBus pins, the differential signal receiving pins, the differential signal transmitting pins, the clock pins, the sideband pins and the ground pins of the SlimSAS connection interface through the boundary scan chip, the HCSL to LVDS module chip, the IIC chip and the CPLD chip. Therefore, the technical effect of improving slot stability and detection coverage of a SlimSAS slot detection can be achieved.

10 Claims, 5 Drawing Sheets

| "A" surface pin number | | "B" surface pin number | |
|---|---|---|---|
| A2 | DIFF0_RX_DP | B20 | DIFF4_TX_DP |
| A3 | DIFF0_RX_DN | B21 | DIFF4_TX_DN |
| A5 | DIFF1_RX_DP | B23 | DIFF5_TX_DP |
| A6 | DIFF1_RX_DN | B24 | DIFF5_TX_DN |
| A14 | DIFF2_RX_DP | B32 | DIFF6_TX_DP |
| A15 | DIFF2_RX_DN | B33 | DIFF6_TX_DN |
| A17 | DIFF3_RX_DP | B35 | DIFF7_TX_DP |
| A18 | DIFF3_RX_DN | B36 | DIFF7_TX_DN |
| A20 | DIFF4_RX_DP | B2 | DIFF0_TX_DP |
| A21 | DIFF4_RX_DN | B3 | DIFF0_TX_DN |
| A23 | DIFF5_RX_DP | B5 | DIFF1_TX_DP |
| A24 | DIFF5_RX_DN | B6 | DIFF1_TX_DN |
| A32 | DIFF6_RX_DP | B14 | DIFF2_TX_DP |
| A33 | DIFF6_RX_DN | B15 | DIFF2_TX_DN |
| A35 | DIFF7_RX_DP | B17 | DIFF3_TX_DP |
| A36 | DIFF7_RX_DN | B18 | DIFF3_TX_DN |

FIG. 3

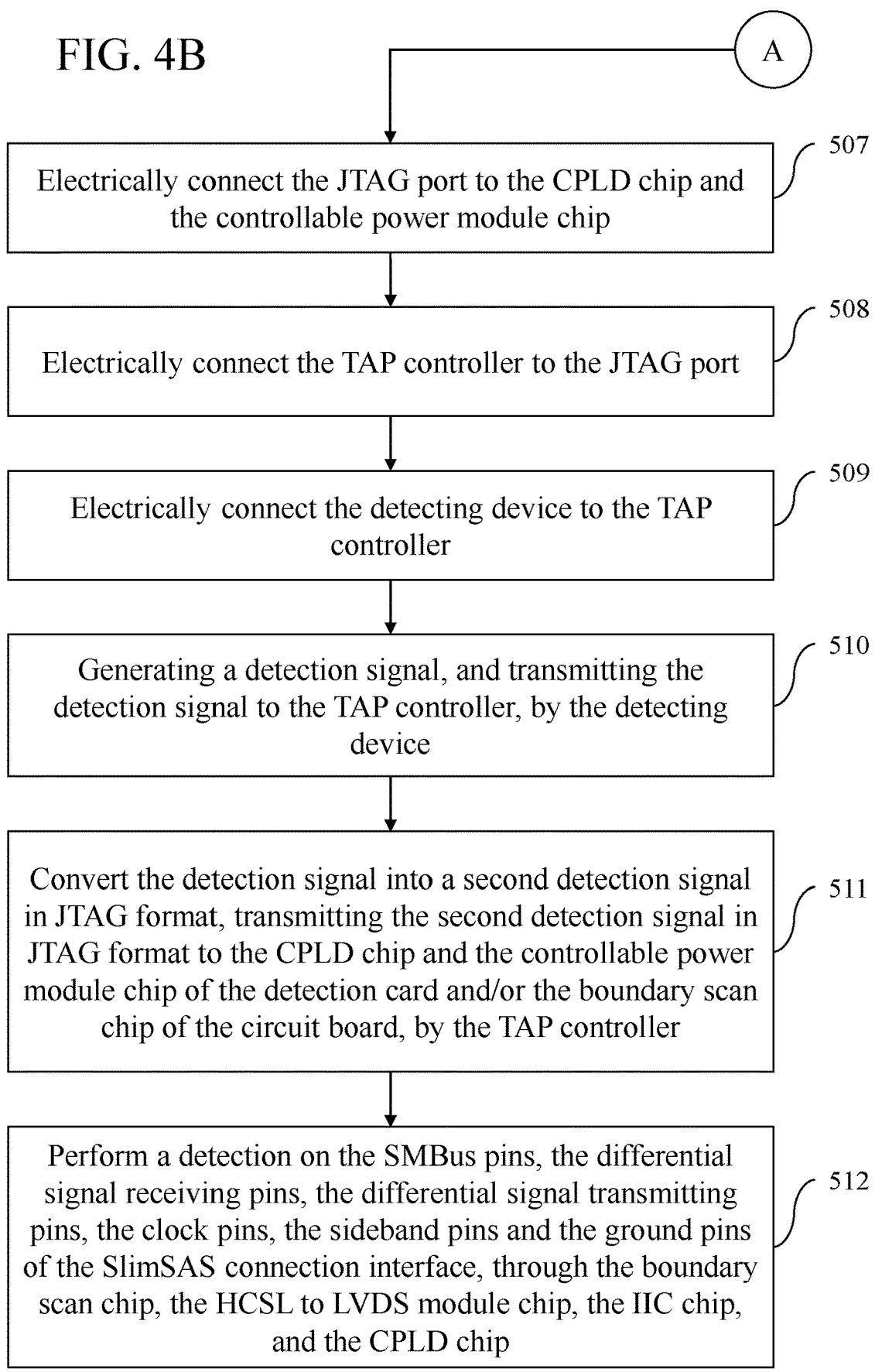

DETECTION SYSTEM FOR SLIMSAS SLOT AND METHOD THEREOF

CROSS-REFERENCE TO RELATED APPLICATION

This application claims the benefit of Chinese Application Serial No. 202211481618.5, filed Nov. 24, 2022, which is hereby incorporated herein by reference in its entirety.

BACKGROUND OF THE INVENTION

1. Field of the Invention

The present invention relates to a detection system and a method thereof, and more particularly to a detection system using a boundary scan chip of a circuit board and/or a HCSL to LVDS module chip, an IIC chip and a CPLD chip of a detection card to detect a SlimSAS slot, and a method thereof.

2. Description of the Related Art

When a conventional boundary scan detection solution is applied for a SlimSAS slot on a motherboard, it is necessary to customize an adapter card for pin conversion, a cable for pin conversion, and an adapter card for SlimSAS, so as to perform a test through a virtual PCIE.

Because of the large number of detection components used in the conventional detection solution, the connections between the detection components are relatively complicated and may cause an unstable detection result, and it is also time-consuming to debug when a defect is detected. In addition, the conventional detection solution is unable to provide a detection coverage for a clock pin signal, a SMBus pin signal, and a sideband pin signal in a SlimSAS slot, and is also unable to provide a detection coverage for short-circuit type faults of differential signal pins in the SlimSAS slot. Furthermore, in order to analyze and test multiple SlimSAS slots, multiple virtual PCIEs are required and the communication with the multiple virtual PCIEs need series connection through JTAG, so the connections between the detection components become more complicated and may cause an unstable detection result.

According to above-mentioned contents, what is needed is to develop an improved solution to solve the problem that the conventional boundary scan detection for SlimSAS slot is unstable, time-consuming in debug, and incomplete in detection coverage.

SUMMARY OF THE INVENTION

An objective of the present invention is to disclose a detection system for a SlimSAS slot and a method thereof, to solve the problem that the conventional boundary scan detection for a SlimSAS slot is unstable, time-consuming in debug, and incomplete in detection coverage.

In order to achieve the objective, the present invention discloses a detection system for a SlimSAS slot, and the detection system includes a circuit board, a detection card, a TAP controller and a detecting device; the detection card includes a SlimSAS connection interface, a HCSL to LVDS module chip, an inter-integrated circuit (IIC) chip, a controllable power module chip, a CPLD chip and a JTAG port.

The circuit board includes at least one SlimSAS slot and a boundary scan chip.

The SlimSAS connection interface of the detection card includes two sets of system management bus (SMBus) pins, differential signal receiving pins, differential signal transmitting pins, two sets of clock pins, sideband pins and ground pins. The HCSL to LVDS module chip is electrically connected the two sets of clock pins. The IIC chip is electrically connected to the SMBus pins. The CPLD chip of the detection card is electrically connected to the HCSL to LVDS module chip, the controllable power module chip, the IIC chip, the sideband pins and the ground pins. The JTAG port of the detection card is electrically connected to the CPLD chip and the controllable power module chip.

The TAP controller is electrically connected to the JTAG port. The detecting device is electrically connected to the TAP controller.

The detecting device generates a detection signal, and transmit the detection signal to the TAP controller, the TAP controller converts the detection signal into a second detection signal in JTAG format, transmits the second detection signal in JTAG format to the CPLD chip and the controllable power module chip of the detection card and/or the boundary scan chip of the circuit board, so that a detection is performed on the SMBus pins, the differential signal receiving pins, the differential signal transmitting pins, the clock pins, the sideband pins and the ground pins of the SlimSAS connection interface through the boundary scan chip, the HCSL to LVDS module chip, the IIC chip, and the CPLD chip.

In order to achieve the objective, the present invention discloses a detection method for SlimSAS slot, and the detection method includes step of: providing a circuit board comprising at least one SlimSAS slot and a boundary scan chip; providing a detection card comprising a SlimSAS connection interface, a HCSL to LVDS module chip, an IIC chip, a controllable power module chip, a CPLD chip, and a JTAG port; inserting the SlimSAS connection interface into one of the at least one SlimSAS slot, wherein the SlimSAS connection interface comprises two sets of SMBus pins, differential signal receiving pins, differential signal transmitting pins, two sets of clock pins, sideband pins and ground pins; electrically connecting the HCSL to LVDS module chip to the two sets of clock pins; electrically connecting the IIC chip to the SMBus pins; electrically connecting the CPLD chip to the HCSL to LVDS module chip, the controllable power module chip, the IIC chip, the sideband pins and the ground pins; electrically connecting the JTAG port to the CPLD chip and the controllable power module chip; electrically connecting the TAP controller to the JTAG port; electrically connecting the detecting device to the TAP controller; generating a detection signal and transmitting the detection signal to the TAP controller by the detecting device; converting the detection signal into a second detection signal in JTAG format, transmitting the second detection signal in JTAG format to the CPLD chip and the controllable power module chip of the detection card and/or the boundary scan chip of the circuit board, by the TAP controller; performing a detection on the SMBus pins, the differential signal receiving pins, the differential signal transmitting pins, the clock pins, the sideband pins and the ground pins of the SlimSAS connection interface, through the boundary scan chip, the HCSL to LVDS module chip, the IIC chip, and the CPLD chip.

According to the above-mentioned system and method of the present invention, the difference between the present invention and the conventional technology is that, in the detection system, the detecting device generates and transmits the detection signal to the TAP controller; the TAP controller converts the received detection signal into a detection signal in JTAG format, and transmits the detection signal in JTAG format to the CPLD chip and the controllable power module chip of the detection card and/or the boundary scan chip of the circuit board, so that the detection can be performed on the SMBus pins, the differential signal receiving pins, the differential signal transmitting pins, the clock pins, the sideband pins and the ground pins of the SlimSAS connection interface through the boundary scan chip, the HCSL to LVDS module chip, the IIC chip and the CPLD chip.

Therefore, the above-mentioned solution of the present invention is able to achieve the technical effect of improving slot stability and detection coverage of a SlimSAS slot detection.

BRIEF DESCRIPTION OF THE DRAWINGS

The structure, operating principle and effects of the present invention will be described in detail by way of various embodiments which are illustrated in the accompanying drawings.

FIG. 3 is a schematic diagram of electrical connections between differential signal receiving pins and differential signal transmitting pins for SlimSAS slot detection, according to the present invention.

FIGS. 4A and 4B are flowcharts of a detection method for SlimSAS slot, according to the present invention.

DETAILED DESCRIPTION OF THE PREFERRED EMBODIMENTS

Figure 1:
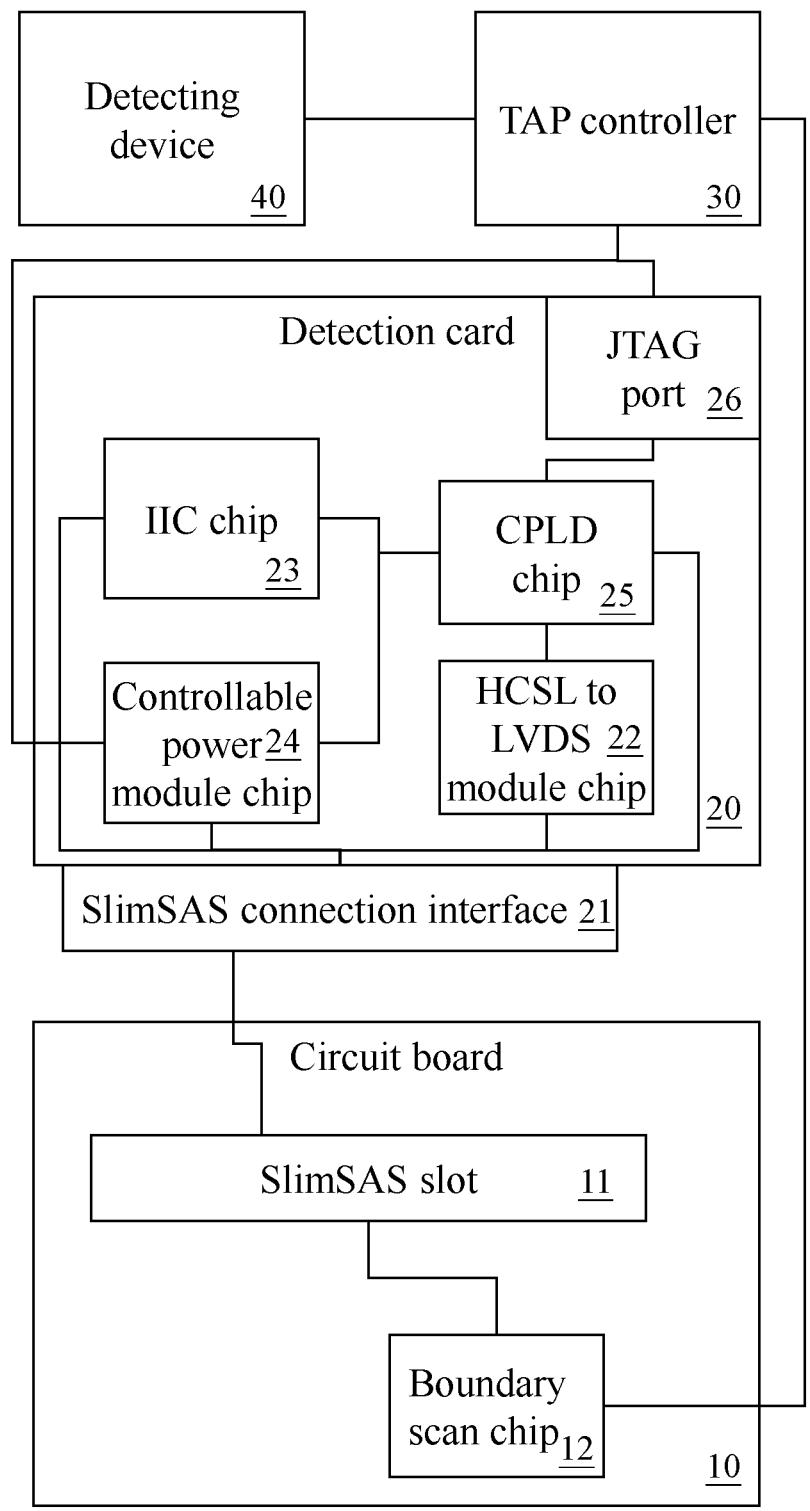
FIG. 1 is a block diagram of a detection system for a SlimSAS slot, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The detection system for a SlimSAS slot of the present invention will be illustrated in the following paragraphs. Please refer to FIG. 1, which is a block diagram of a detection system for a SlimSAS slot of the present invention.

As shown in FIG. 1, the detection system includes a circuit board 10, a detection card 20, a TAP controller 30, and a detecting device 40. The detection card 20 includes a SlimSAS connection interface 21, a HCSL to LVDS module chip 22, an IIC chip 23, a controllable power module chip 24, a CPLD chip 25, and a JTAG port 26.

The circuit board 10 includes at least one SlimSAS slot 11 and a boundary scan chip 12, the SlimSAS connection interface 21 of the detection card 20 is inserted to one of the at least one SlimSAS slot 11 of the circuit board 10, the TAP controller 30 is electrically connected to the JTAG port 26 and the boundary scan chip 12 of the circuit board 10, and the detecting device 40 is electrically connected to the TAP controller 30.

Figure 2:
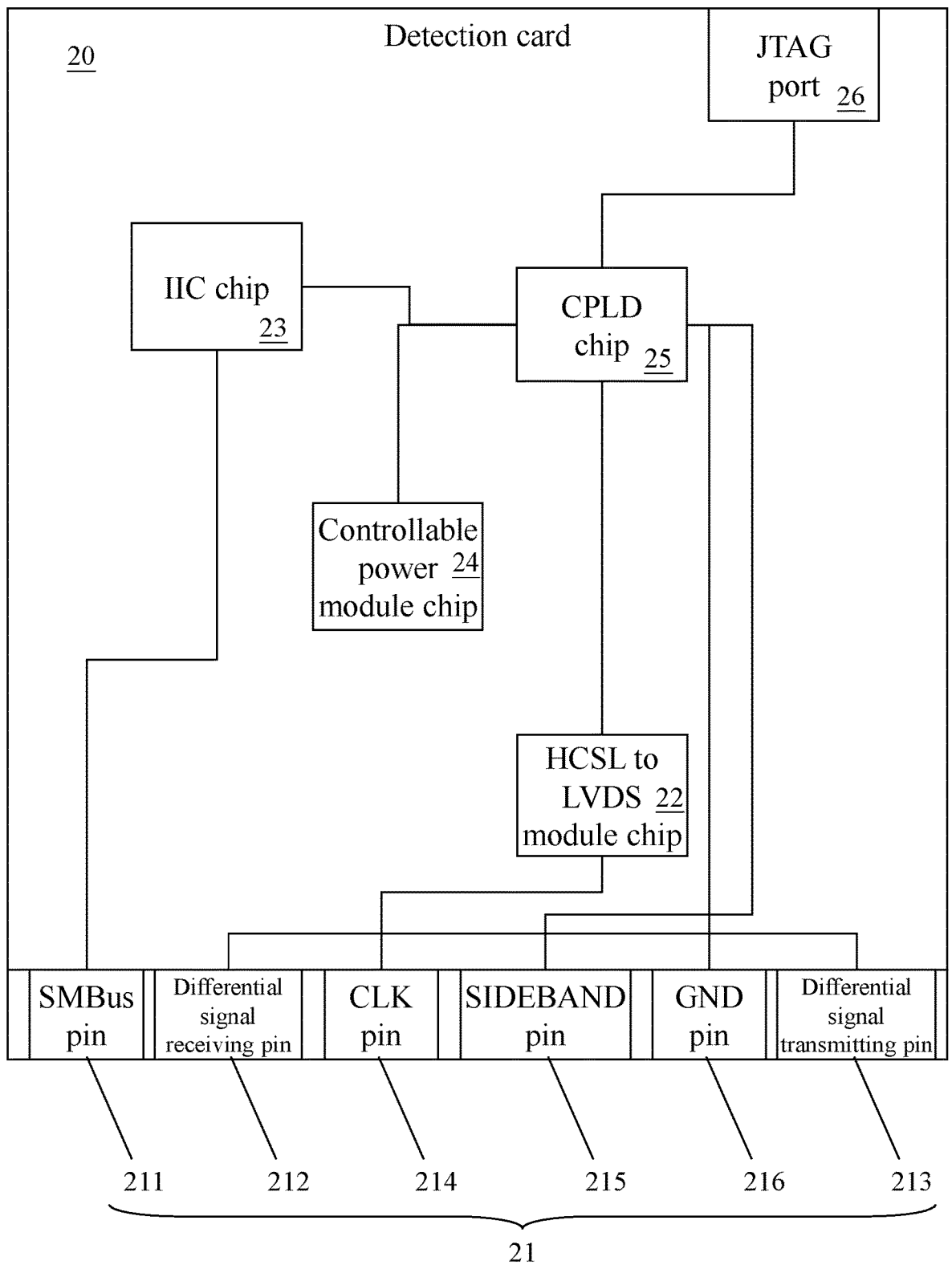
FIG. 2 is a block diagram of a detection card of a detection system for a SlimSAS slot, according to the present invention.

Please refer to FIG. 2, which is a block diagram of a detection card of a detection system for a SlimSAS slot, according to the present invention.

The SlimSAS connection interface 21 of the detection card 20 includes two sets of SMBus pins 211, differential signal receiving pins 212, differential signal transmitting pins 213, two sets of clock (CLK) pins 214, sideband (SIDEBAND) pins 215 and ground (GND) pins 216.

The HCSL to LVDS module chip 22 of the detection card 20 is electrically connected to the two sets of CLK pins 214; the IIC chip 23 of the detection card 20 is electrically connected to the SMBus pins 211; the CPLD chip 25 of the detection card 20 is electrically connected to the HCSL to LVDS module chip 22, the controllable power module chip 24, the IIC chip 23, the SIDEBAND pins 215 and the GND pins 216; the JTAG port 26 of the detection card 20 is electrically connected to the CPLD chip 25 and the controllable power module chip 24.

In order to detect the SlimSAS slot 11 of the circuit board 10, the detecting device 40 generates and transmits a detection signal to the TAP controller 30, the TAP controller 30 converts the received detection signal into a detection signal in JTAG format, and transmits the detection signal in JTAG format to the CPLD chip 25 and the controllable power module chip 24 of a detection card 20 and/or the boundary scan chip 12 of the circuit board 10, so that a detection can be performed on the SMBus pins 211, the differential signal receiving pins 212, the differential signal transmitting pins 213, the CLK pins 214, the SIDEBAND pins 215 and the ground pins 216 of the SlimSAS connection interface 21 through the boundary scan chip 12, the HCSL to LVDS module chip 22, the IIC chip 23 and the CPLD chip 25.

Please refer to FIG. 3, which is a schematic diagram of electrical connections between differential signal receiving pins and a differential signal transmitting pins for a detection on a SlimSAS slot, according to the present invention.

In the detection card 20, one of the differential signal receiving pins 212 of the SlimSAS connection interface 21 and specified one of the differential signal transmitting pins 213 are arranged in a staggered and shifted manner. It should be noted that the differential signal receiving pins 212 and the differential signal transmitting pins 213 are disposed on different surfaces of the SlimSAS connection interface 21; for example, one of the surfaces of the SlimSAS connection interface 21 is called the "A" surface, and another of the surfaces of the SlimSAS connection interface 21 is called the "B" surface.

In an embodiment, the SlimSAS connection interface 21 has 8 sets of differential pins, the pins 2, 5, 14, 17, 20, 23, 32 and 35 on the "A" surface of the SlimSAS connection interface 21 are DIFF_RX_DP pins (that is, the differential signal receiving pins 212), and the pins 3, 6, 15, 18, 21, 24, 33 and 36 on the "A" surface of the SlimSAS connection interface 21 are DIFF_RX_DN pins (that is, the differential signal receiving pins 212).

The pins 2, 5, 14, 17, 20, 23, 32 and 35 on the "B" surface of the SlimSAS connection interface 21 are DIFF_TX_DP pins (that is, the differential signal transmitting pins 213), and the pins 3, 6, 15, 18, 21, 24, 33 and 36 on the "B" surface of the SlimSAS connection interface 21 are DIFF_TX_DN pins, (that is, the differential signal transmitting pins 213).

The pin 2 on the "A" surface of the SlimSAS connection interface 21 is electrically connected to the pin 20 on the "B" surface of the SlimSAS connection interface 21, the pin 3 on the "A" surface of the SlimSAS connection interface 21 is electrically connected to the pin 21 on the "B" surface of the SlimSAS connection interface 21; the pin 5 on the "A" surface of the SlimSAS connection interface 21 is electrically connected to the pin 23 on the "B" surface of the SlimSAS connection interface 21; the pin 6 on the "A" surface of the SlimSAS connection interface 21 is electrically connected to the pin 24 on the "B" surface of the SlimSAS connection interface 21; the pin 14 on the "A" surface of the SlimSAS connection interface 21 is electrically connected to the pin 32 on the "B" surface of the SlimSAS connection interface 21; the pin 15 on the "A" surface of the SlimSAS connection interface 21 is electrically connected to the pin 33 on the "B" surface of the SlimSAS connection interface 21. As shown in FIG. 3, the connection relationship between another pins is the same as the above-mentioned examples, so the detailed description is not repeated therein.

When the boundary scan chip 12 of the circuit board 10 receives the detection signal in JTAG format from the TAP controller 30 and performs a differential signal detection, the boundary scan chip 12 of the circuit board 10 pushes the detection signal in JTAG format to the differential signal receiving pins 212 (that is, the pins 2, 5, 14, 17, 20, 23, 32 and 35 on the "A" surface of the SlimSAS connection interface 21 and the pins 3, 6, 15, 18, 21, 24, 33 and 36 on the "A" surface of the SlimSAS connection interface 21) by boundary scan manner.

Next, the boundary scan chip 12 receives signals from the differential signal transmitting pins 213 (that is, the pins 20, 23, 32, 35, 2, 5, 14 and 17 on the "B" surface of the SlimSAS connection interface 21 and the pins 21, 24, 33, 36, 3, 6, 15 and 18 on the "B" surface of the SlimSAS connection interface 21), so as to perform the differential signal detection on the differential signal receiving pins 212 and the specified differential signal transmitting pins 213.

When the boundary scan chip 12 of the circuit board 10 receives the detection signal in JTAG format from the TAP controller 30 and performs a detection on the SMBus pins, the boundary scan chip 12 of the circuit board 10 simulates a detection signal of IIC protocol based on the detection signal in JTAG format, and then transmits the simulated detection signal of IIC protocol to the IIC chip 23 of the detection card 20 through the SMBus pins 211, so as to implement a signal detection for the SMBus pins.

When the boundary scan chip 12 of the circuit board 10 receives the detection signal in JTAG format from the TAP controller 30 and performs a detection on the CLK pins, the boundary scan chip 12 of the circuit board 10 transmits a HCSL signal to the CPLD chip 25 of the detection card 20 through the CLK pins 214 and the HCSL to LVDS module chip 22 of the detection card 20, to implement a signal detection for the CLK pins.

When the CPLD chip 25 of the detection card 20 receives the detection signal in JTAG format from the TAP controller 30 and performs a signal detection for the SIDEBAND pins or the GND pins, the CPLD chip 25 of the detection card 20 performs a boundary scan detection on the SIDEBAND pins 215 and the GND pins 216 directly electrically connected thereto, so as to implement a signal detection for the SIDEBAND pins and the GND pins.

The operation of the method of the present invention will be illustrated in the following paragraphs, and please refer to FIGS. 4A and 4B, which are flowcharts of a detection method for SlimSAS slot of the present invention.

Figure 4A:
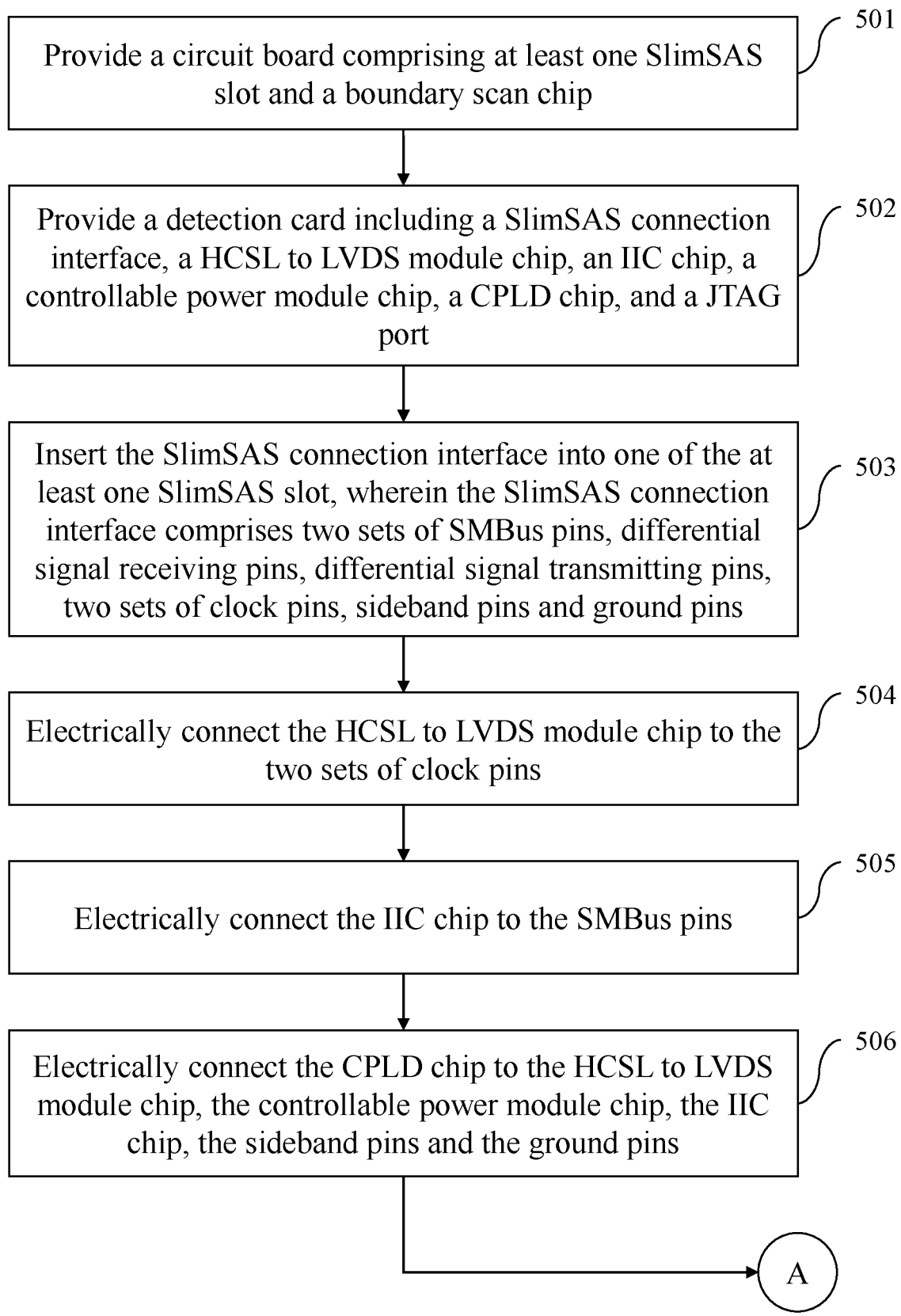

As shown in FIGS. 4A and 4B, the detection method includes the following steps. In a step 501, a circuit board comprising at least one SlimSAS slot and a boundary scan chip is provided. In a step 502, a detection card including a SlimSAS connection interface, a HCSL to LVDS module chip, an IIC chip, a controllable power module chip, a CPLD chip, and a JTAG port is provided. In a step 503, the SlimSAS connection interface is inserted into one of the at least one SlimSAS slot, wherein the SlimSAS connection interface comprises two sets of SMBus pins, differential signal receiving pins, differential signal transmitting pins, two sets of clock pins, sideband pins and ground pins. In a step 504, the HCSL to LVDS module chip is electrically connected to the two sets of clock pins. In a step 505, the IIC chip is electrically connected to the SMBus pins. In a step 506, the CPLD chip is electrically connected to the HCSL to LVDS module chip, the controllable power module chip, the IIC chip, the sideband pins and the ground pins. In a step 507, the JTAG port is electrically connected to the CPLD chip and the controllable power module chip. In a step 508, the TAP controller is electrically connected to the JTAG port. In a step 509, the detecting device is electrically connected to the TAP controller. In a step 510, the detecting device generates and transmits a detection signal to the TAP controller. In a step 511, the TAP controller converts the detection signal into a detection signal in JTAG format, and transmits the second detection signal in JTAG format to the CPLD chip and the controllable power module chip of the detection card and/or the boundary scan chip of the circuit board. In a step 512, a detection is performed on the SMBus pins, the differential signal receiving pins, the differential signal transmitting pins, the clock pins, the sideband pins and the ground pins of the SlimSAS connection interface, through the boundary scan chip, the HCSL to LVDS module chip, the IIC chip, and the CPLD chip.

According to above-mentioned contents, the difference between the present invention and the conventional technology, in the detection system, the detecting device generates and transmits the detection signal to the TAP controller; the TAP controller converts the received detection signal into the detection signal in JTAG format, and transmits the detection signal in JTAG format to the CPLD chip and the controllable power module chip of the detection card and/or the boundary scan chip of the circuit board, so that the detection can be performed on the SMBus pins, the differential signal receiving pins, the differential signal transmitting pins, the CLK pins, the SIDEBAND pins and the ground pins of the SlimSAS connection interface through the boundary scan chip, the HCSL to LVDS module chip, the IIC chip and the CPLD chip.

Therefore, the above-mentioned solution of the present invention is able to solve the problem that the conventional boundary scan detection for a SlimSAS slot is unstable, time-consuming in debug, and incomplete in detection coverage, so as to achieve the technical effect of improving slot stability and detection coverage of a SlimSAS slot detection.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A detection system for a SlimSAS slot, comprising:
a circuit board, comprising at least one SlimSAS slot and a boundary scan chip;
a detection card, comprising:
    a SlimSAS connection interface, comprising two sets of system management bus (SMBus) pins, differential signal receiving pins, differential signal transmitting pins, two sets of clock pins, sideband pins and ground pins;
    a HCSL to LVDS module chip, electrically connected the two sets of clock pins;
    an inter-integrated circuit (IIC) chip, electrically connected to the SMBus pins;
    a controllable power module chip;
    a complex programmable logic device (CPLD) chip, electrically connected to the HCSL to LVDS module chip, the controllable power module chip, the HC chip, the sideband pins and the ground pins; and
    a joint test action group (JTAG) port, electrically connected to the CPLD chip and the controllable power module chip;
a test access port (TAP) controller, electrically connected to the JTAG port; and
a detecting device, electrically connected to the TAP controller;
wherein the detecting device generates a detection signal, and transmit the detection signal to the TAP controller, the TAP controller converts the detection signal into a second detection signal in JTAG format, transmits the second detection signal in JTAG format to the CPLD chip and the controllable power module chip of the detection card and/or the boundary scan chip of the circuit board, so that a detection is performed on the SMBus pins, the differential signal receiving pins, the differential signal transmitting pins, the clock pins, the sideband pins and the ground pins of the SlimSAS connection interface through the boundary scan chip, the HCSL to LVDS module chip, the HC chip, and the CPLD chip.

2. The detection system for a SlimSAS slot according to claim 1, wherein one of the differential signal receiving pins and specified one of the differential signal transmitting pins are arranged in a staggered and shifted manner and electrically connected to each other, the boundary scan chip of the circuit board performs a boundary scan detection based on the detection signal in JTAG format, to implement a differential signal detection for the one of the differential signal receiving pins and the specified one of the differential signal transmitting pins.

3. The detection system for a SlimSAS slot according to claim 1, wherein the boundary scan chip simulates a third detection signal of IIC protocol based on the second detection signal in JTAG format, transmits the simulated third detection signal of IIC protocol to the IIC chip through the SMBus pins, to implement a signal detection for the SMBus pins.

4. The detection system for a SlimSAS slot according to claim 1, wherein the boundary scan chip transmits a HCSL signal to the CPLD chip through the clock pins and the HCSL to LVDS module chip, to implement a signal detection for the clock pins.

5. The detection system for a SlimSAS slot according to claim 1, wherein the CPLD chip performs a boundary scan detection on the sideband pins and the ground pins directly electrically connected thereto, to implement a signal detection for the sideband pins and the ground pins.

6. A detection method for SlimSAS slot, comprising:
providing a circuit board comprising at least one SlimSAS slot and a boundary scan chip;
providing a detection card comprising a SlimSAS connection interface, a HCSL to LVDS module chip, an IIC chip, a controllable power module chip, a CPLD chip, and a JTAG port;
inserting the SlimSAS connection interface into one of the at least one SlimSAS slot, wherein the SlimSAS connection interface comprises two sets of SMBus pins, differential signal receiving pins, differential signal transmitting pins, two sets of clock pins, sideband pins and ground pins;
electrically connecting the HCSL to LVDS module chip to the two sets of clock pins;
electrically connecting the IIC chip to the SMBus pins;
electrically connecting the CPLD chip to the HCSL to LVDS module chip, the controllable power module chip, the IIC chip, the sideband pins and the ground pins;
electrically connecting the JTAG port to the CPLD chip and the controllable power module chip;
electrically connecting a TAP controller to the JTAG port;
electrically connecting a detecting device to the TAP controller;
generating a detection signal, and transmitting the detection signal to the TAP controller, by the detecting device;
converting the detection signal into a second detection signal in JTAG format, transmitting the second detection signal in JTAG format to the CPLD chip and the controllable power module chip of the detection card and/or the boundary scan chip of the circuit board, by the TAP controller; and
performing a detection on the SMBus pins, the differential signal receiving pins, the differential signal transmitting pins, the clock pins, the sideband pins and the ground pins of the SlimSAS connection interface, through the boundary scan chip, the HCSL to LVDS module chip, the IIC chip, and the CPLD chip.

7. The detection method for SlimSAS slot according to claim 6, wherein the step of performing the detection on the SMBus pins, the differential signal receiving pins, the differential signal transmitting pins, the clock pins, the SIDEBAND pins and the ground pins of the SlimSAS connection interface through the boundary scan chip, the HCSL to LVDS module chip, the IIC chip and the CPLD chip, further comprises: one of the differential signal receiving pins and specified one of the differential signal transmitting pins are arranged in a staggered and shifted manner and electrically connected to each other, the boundary scan chip of the circuit board performs a boundary scan detection based on the detection signal in JTAG format, to implement a differential signal detection for the one of the differential signal receiving pins and the specified one of the differential signal transmitting pins.

8. The detection method for SlimSAS slot according to claim 6, wherein the step of performing the detection on the SMBus pins, the differential signal receiving pins, the differential signal transmitting pins, the clock pins, the sideband pins and the ground pins of the SlimSAS connection interface, through the boundary scan chip, the HCSL to LVDS module chip, the IIC chip, and the CPLD chip, further comprises: the boundary scan chip simulates a third detection signal of IIC protocol based on the second detection signal in JTAG format, transmits the simulated third detection signal of IIC protocol to the IIC chip through the SMBus pins, to implement a signal detection for the SMBus pins.

9. The detection method for SlimSAS slot according to claim 6, wherein the step of performing the detection on the SMBus pins, the differential signal receiving pins, the differential signal transmitting pins, the clock pins, the SIDEBAND pins and the ground pins of the SlimSAS connection interface, through the boundary scan chip, the HCSL to LVDS module chip, the IIC chip, and the CPLD chip, further comprises: the boundary scan chip transmits a HCSL signal to the CPLD chip through the clock pins and the HCSL to LVDS module chip, to implement a signal detection for the clock pins.

10. The detection method for SlimSAS slot according to claim 6, wherein the step of performing the detection on the SMBus pins, the differential signal receiving pins, the differential signal transmitting pins, the clock pins, the sideband pins and the ground pins of the SlimSAS connection interface, through the boundary scan chip, the HCSL to LVDS module chip, the IIC chip, and the CPLD chip, further comprises: the CPLD chip performs a boundary scan detection on the sideband pins and the ground pins directly electrically connected thereto, to implement a signal detection for the sideband pins and the ground pins.

* * * * *